United States Patent [19]
Chen

[11] Patent Number: 6,077,724
[45] Date of Patent: Jun. 20, 2000

[54] MULTI-CHIPS SEMICONDUCTOR PACKAGE AND FABRICATION METHOD

[75] Inventor: Tsung-Chieh Chen, Taipei, Taiwan

[73] Assignee: First International Computer Inc., Taipei, Taiwan

[21] Appl. No.: 09/148,972

[22] Filed: Sep. 5, 1998

[51] Int. Cl.[7] .......................... H01L 21/44; H01L 21/48; H01L 21/50; H01L 29/40; H01L 23/48
[52] U.S. Cl. .......................... 438/107; 438/109; 438/108; 438/123; 438/611; 438/613; 257/777; 257/723; 257/738; 257/780
[58] Field of Search .................................... 438/107, 108, 438/109, 123, 611, 613; 257/777, 723, 684, 738, 780, 786

[56] References Cited

U.S. PATENT DOCUMENTS

| | | | |
|---|---|---|---|
| 5,422,435 | 6/1995 | Takiar et al. | 174/52.4 |
| 5,527,740 | 6/1996 | Golwalkar et al. | 437/206 |
| 5,715,593 | 2/1998 | Kimura | 29/827 |
| 5,963,430 | 10/1999 | Londa | 361/790 |

*Primary Examiner*—Wael Fahmy
*Assistant Examiner*—Neal Berezny
*Attorney, Agent, or Firm*—W. Wayne Liauh

[57] ABSTRACT

A multi-chips semiconductor package and fabrication method mainly combines LOC and BGA techniques to overlap one chip upon another chip in an IC component package. One chip uses leads of a lead frame as connection interface of the circuit in the chip to outside. Another chip uses solder balls as connection interface of the circuit in another chip to outside. The two chips are supported by the lead frame without a substrate used in a conventional BGA package. The two chips may have same or different function. The structure is simple and easy to produce at low cost. The size and length of the IC component is smaller than the one produced by conventional multi-chips packaging techniques.

12 Claims, 5 Drawing Sheets

MULTI-CHIPS SEMICONDUCTOR PACKAGE AND FABRICATION METHOD

BACKGROUND OF THE INVENTION

1. Field of the Invention

This invention relates to a multi-chips semiconductor package and fabrication method, and particularly to a semiconductor package and fabrication method that includes two or more chips with same or different function overlapping with one another in the package, one of the chips using a lead frame as connection interface with external circuit while another chip using solder balls as connection interface with external circuit.

2. Description of the Prior Art

In the semiconductor industry, one of the research subjects almost all companies have tried to focus is to put as many logic circuits as possible in a smaller semiconductor package to reduce cost. One approach for this issue is to shrink the circuit design to a smaller width. Another approach is to cram two or more chips in a package so that cost may be reduced while circuit density may be increased at similar package size.

FIG. 1 shows one of conventional multi-chips semiconductor package examples which uses Lead On Chip (LOC) technology to connect two chips 1a and 1b respectively with two lead frames 3a and 3b through two-sided adhesive tapes 2a and 2b, then bond the chips 1a and 1b respectively to the mating leads of the lead frames 3a and 3b via bonding wires 4a and 4b. The leads of the lead frame 3a then connect with the leads 6 of the lead frame 3b. The whole assembly is filled and wrapped with molding epoxy 5 to form a complete semiconductor package component. In this example, the leads 6 of the lead frame 3b are used as connection interface between the circuits on the chips 1a and 1b and external circuits. When circuit chip number is doubled in the package the number of leads 6 shall also be doubled. Hence the length of t package component has to increase to accommodate more leads need In recent years, lead number of a single chip package component (such as 4 MB DRAM IC) has increased from twenty or thirty leads to forty-two or fifty leads. As a lead has a fixed width, the length of the IC component has increased significantly. Adopting the technique set forth above, the lead number of a package component could easily reach eighty leads or even one hundred leads. The package size becomes too big and not practical.

FIG. 2 shows another conventional multi-chips semiconductor package example. It employs Ball Grid Array (BGA) technology which uses EPOXY to adhere two chips 7a and 7b together, and then mounts the chips on a substrate 8. The chips 7a and 7b are bonded respectively with mating bonding pads located in the substrate 8 via gold wires 9a and 9b. The bonding pads connect with an array of solder balls 10 located on the bottom surface of the substrate 8. Through such a structure and package, the circuitry in the chips 7a and 7b may connect with external circuitry via the solder balls 10. One of the drawbacks of the BGA package is the large size of the substrate 8 resulting from solder ball array formation. Another problem is that the length of gold wire 9a is almost twice that of the gold wire 9b. The bonding of lengthy gold wire is difficult and may cause many other problems such as broken wire due to external force or overheating resulting from high resistance of lengthy wire. Moreover the size of the chip 7a on the top must be smaller than the size of the chip 7b at the bottom. Same size or same specification of chips cannot be used in this package. High density of gold wires 9a and 9b in the package is another source of the defect when molding with EPOXY. The gold wires are prone to break in the molding process and resulting in low yield of production. Both LOC and BGA methods have their practical limitation for multi-chips package application because of aforesaid problems.

SUMMARY OF THE INVENTION

In view of aforesaid disadvantages, it is therefore an object of this invention to provide a multi-chips semiconductor package and fabrication method that enables two or more chips be packaged together in a small size easily in a simple structure and be produced at low cost.

It is another object of this invention to provide a multi-chips semiconductor package and fabrication method that combines both LOC and BGA techniques for packing two chips in an IC component. It resolves the problems arisen by using only LOC technique or only BGA technique as set forth above, and may include two chips of same or different function in a single package.

According to one aspect of this invention, there is provided with at least two chips (e.g., a first chip and a second chip), a lead frame with a plurality of leads, a plurality of solder balls and packaging epoxy. Each chip has an active side and an inactive side. On the active side, there are a plurality of bonding pads serving as connection interface between the circuitry in the chip and an external circuitry. The bonding pads of the active side of the second chip are connected to the mating leads. The inactive side of the first chip engages with the lead frame. The solder balls are formed directly on the bonding pads in the active side of the first chip. The epoxy fills and wraps the whole package to form a complete package component. The leads and solder balls are exposed to the outside of the package for serving as connection interface to external circuitry. As the package according to this invention is supported by the lead frame and without a substrate used in a conventional BGA design, the component can be made in a small size. Since both leads and solder balls are used as connection interface, there is no need for many leads. IC component length thus may be shorter. The whole structure is simple and easy to produce at low cost.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
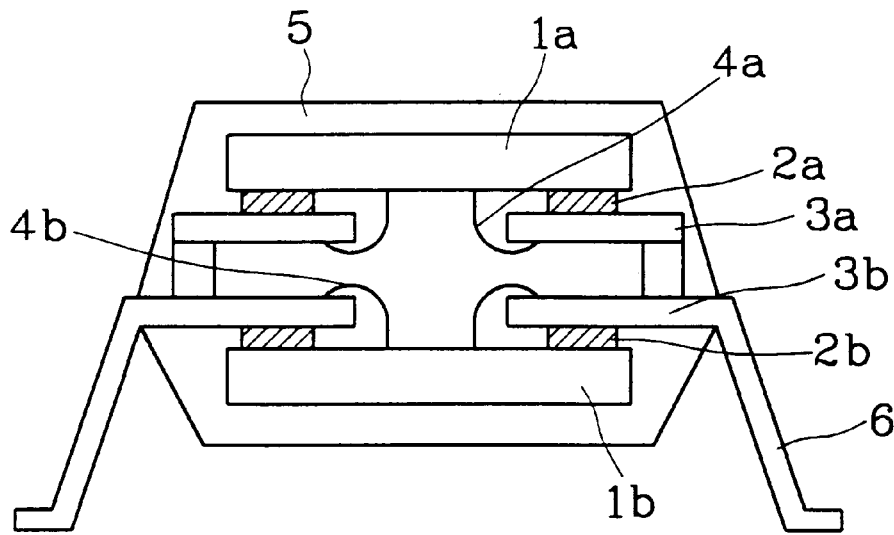
FIG. 1 is a sectional view of a conventional multi-chips semiconductor package.
Figure 2:
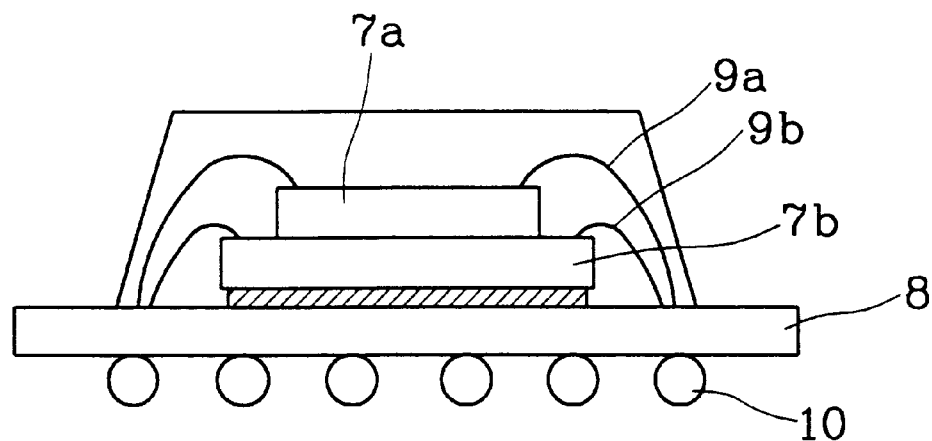
FIG. 2 is a sectional view of another conventional multi-chips semiconductor package.
Figure 3:
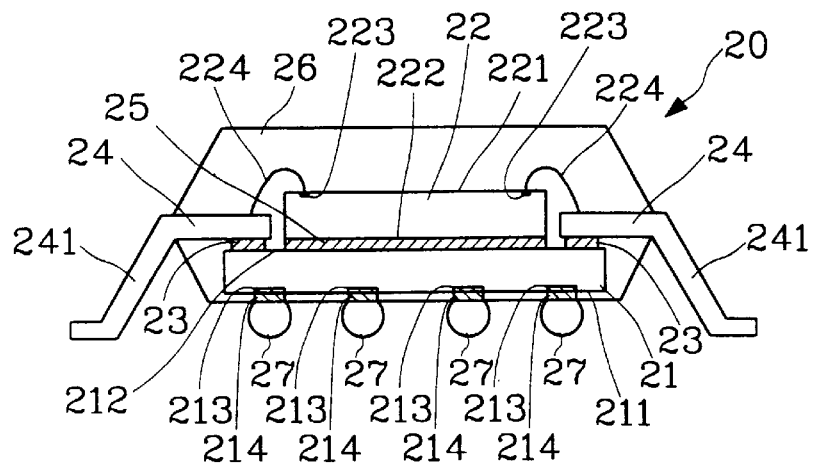
FIG. 3 is a sectional view of an embodiment of this invention.

This invention combines the techniques of Lead On Chip (LOC) and Ball Grid Array (BGA) to package two chips in an IC component. One of the chips uses leads as connection interface between the chip circuitry and external circuitry. Another chip uses solder balls array as the interface. The substrate needed for BGA may be dispensed herewith since the chips are supported by a lead frame. The two chips may have same or different function and size. The structure is simple and easy to produce at low cost. The package size and length may be shrunk to a small dimension. More details will be elaborated as follows:

FIG. 3 shows an embodiment of this invention. A multi-chips semiconductor package (IC) 20 according to this invention includes at least a first chip 21, a second chip 22, a lead frame 24, a plurality of solder balls 27 and molding epoxy 26. The first chip 21 and second chip 22 have respectively an active side 211 and 221 on which a plurality of bonding pads 213 and 223 are provided as connection interfaces between the circuitries of the chips and external circuitry. The bonding pads 213 and 223 are also known in industry as metal pad or aluminum pad (A1 pad). Opposite to the active side of each chip are inactive sides 212 and 222.

The lead frame 24 has a plurality of leads 241 connecting at one side thereof respectively with the bonding pads 223 of the second chip 22 through gold wire bonding 224. The inactive side 222 of the second chip 22 is adhered to the inactive side 212 of the first chip 21 by means of epoxy 25. The lead frame 24 at another side thereof is also adhered to the inactive side 212 of the chip 21 through a dual-sided adhesive tape 23. However, any person skilled in the art may also understand that, the dual-sided adhesive tape 23 may also substitute the epoxy 25 for adhering the second chip 22 to the first chip 21.

The bonding pads 213 of the first chip 21 have a plurality of inner balls 213 disposed thereon, then a plurality of solder balls 27 are deposited on the inner balls 214 for connecting with the bonding pads 213. A molding epoxy 26 is then filled around the first and the second chips 21 and 22 to form a complete IC package 20 with the leads 241 and solder balls 27 exposed as connection interface to external circuitry.

The first chip 21 uses the solder balls 27 as connection interface to outside while the second chip 22 uses the leads 241 of the lead frame 24 as connection interface to outside circuitry. Both the chips 21 and 22 are engaged with the lead frame 24, thus a substrate used in a conventional BGA design may be dispensed with in this invention. Total size and length of this package is thus smaller. Total number of components is less and the structure is simpler and thus may result in lower product cost. The first chip 21 and the second chip 22 may have same function and be coupled together. Or they may have different function and be separated from one another, such as one for logic circuit and another for memory circuit. With one IC package contains two or more different function chips, the flexibility and versatility of IC design increases greatly.

Figure 4:
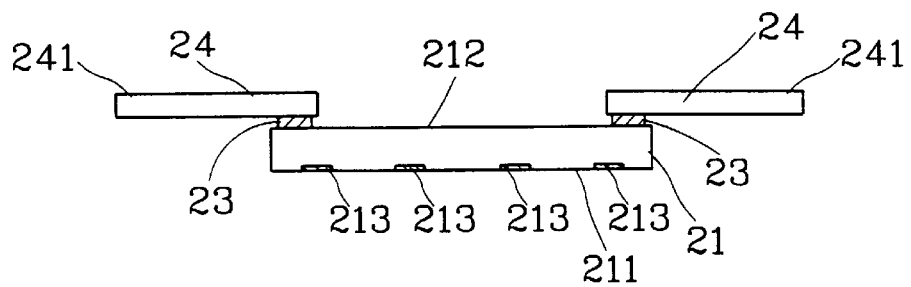
FIG. 4A–4F are sectional views of fabrication procedures for an embodiment shown in FIG. 3.
Figure 4:
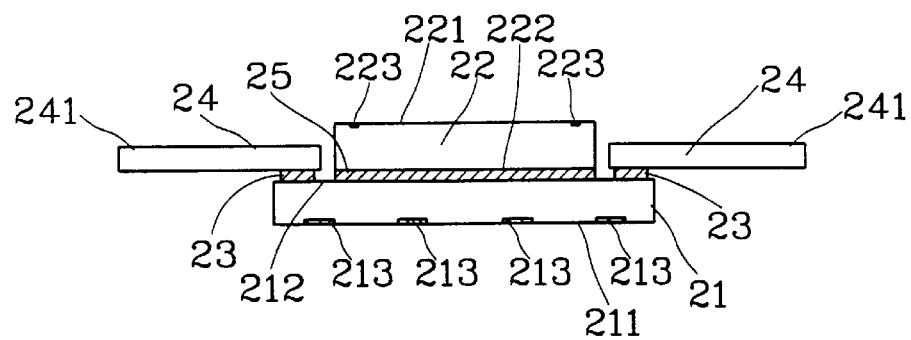
Figure 4:
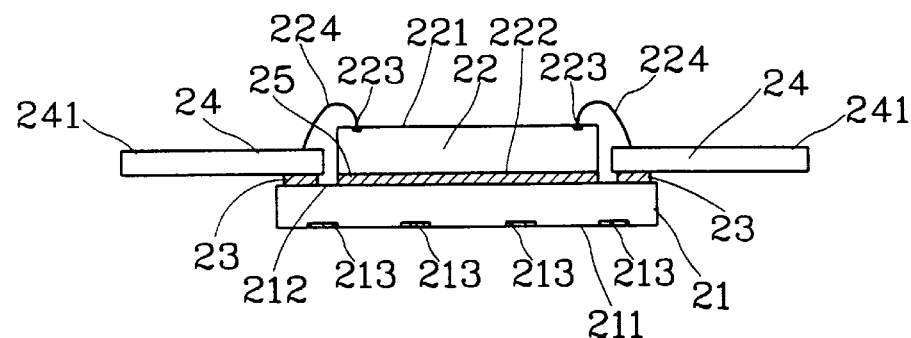
Figure 4:
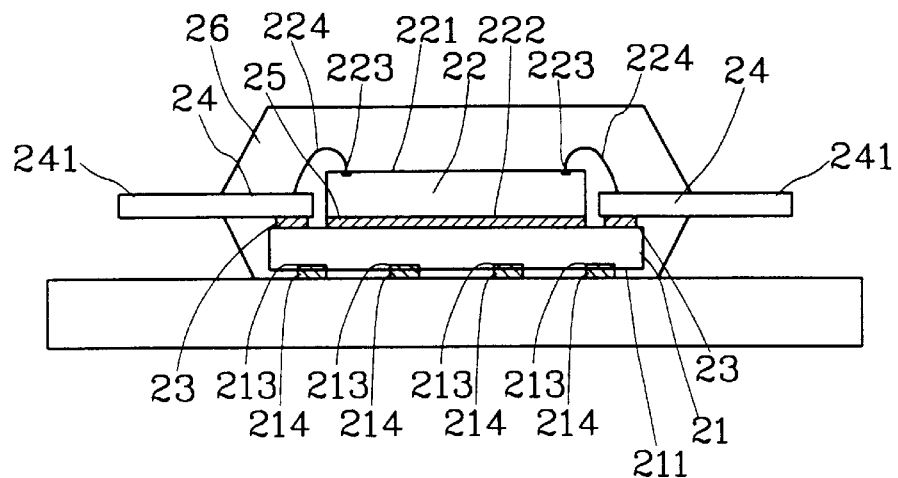
Figure 4:
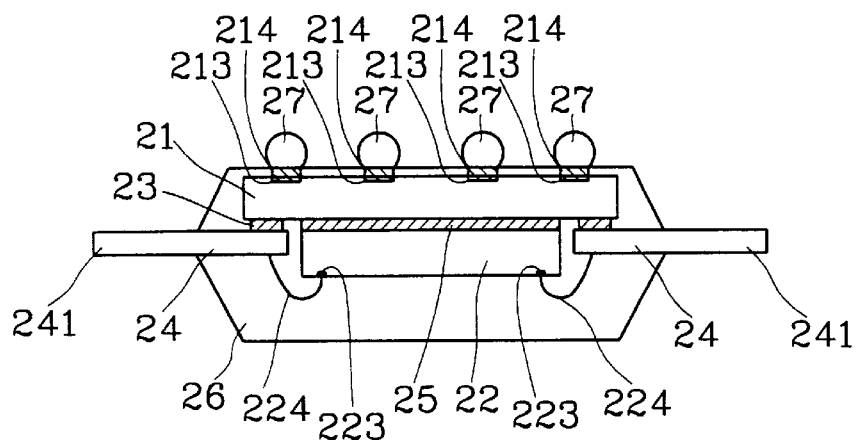
Figure 4:
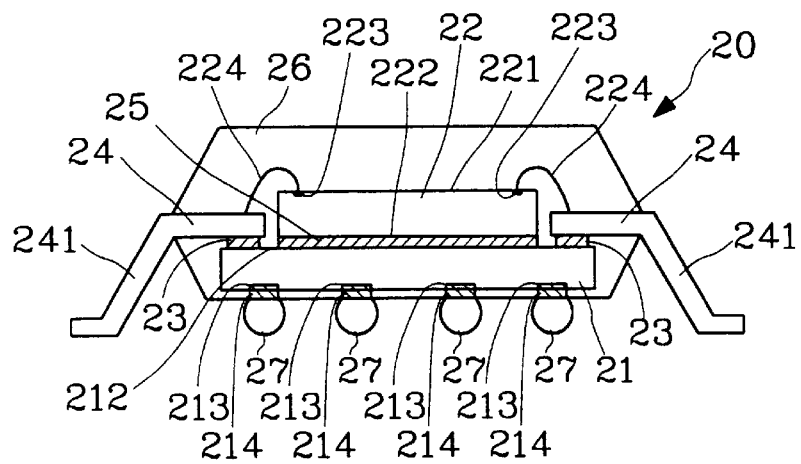

FIGS. 4A through 4F illustrate preferred fabrication procedures for the embodiment shown in FIG. 3 with detailed steps as follow:

a. adhering the lead frame 24 which has a plurality of leads 241 to the inactive side 212 of the first chip 21 through at least one double-sided adhesive tape 23 (as shown in FIG. 4A);

b. adhering the inactive side 222 of the second chip 22 to the inactive side 212 of the first chip 21 by means of epoxy 25 (as shown in FIG. 4B);

c. bonding the bonding pads 223 on the active side 221 of the second chip 22 with the leads 241 through bonding wire 224 (as shown in FIG. 4C);

d. depositing a plurality of inner balls 214 on the bonding pads 213 on the active side 211 of the first chip 21, filling molding epoxy 26 around the first and second chips 21 and 22 to form an IC package, with part of the leads 241 and inner balls 214 exposed to outside (as shown in FIG. 4D);

e. depositing solder balls 27 on the inner balls 24 for connecting the circuit of the first chip 21 to outside (as shown in FIG. 4E);

f. deforming the leads 241 toward the solder balls 27 at a desired angle, length and shape to form a complete IC package 20 (as shown in FIG. 4F).

Figure 5:
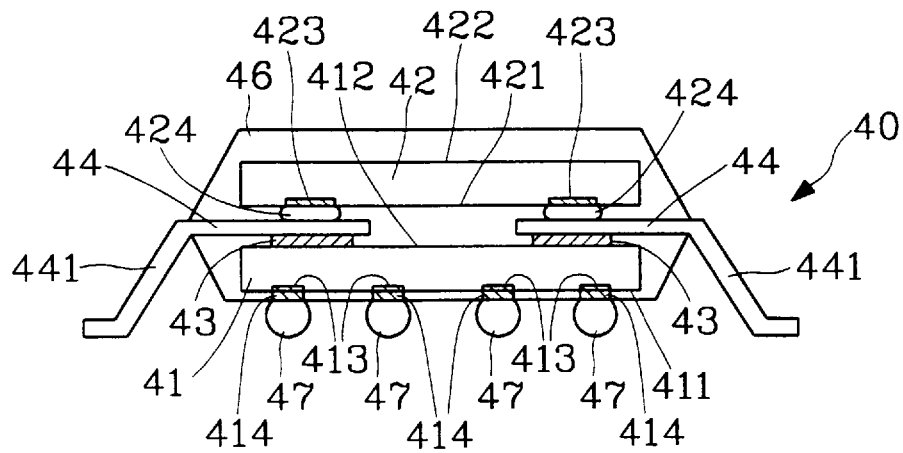
FIG. 5 is a sectional view of another embodiment of this invention.

FIG. 5 shows another preferred embodiment of this invention. Like the embodiment shown in FIG. 3, the IC package 40 also has a first chip 41, a second chip 42, a lead frame 44 with a plurality of leads 441, a plurality of solder balls 47 and molding epoxy 46 for filling and wrapping the package. The first and second chips 41 and 42 have respectively an active side 411 and 421 which have a plurality of bonding pads 412 and 423 located thereon, and inactive side 412 and 422 opposite to the active side 411 and 421 respectively.

The inactive side 412 of the first chip 41 is adhered to one side of the lead frame 44 by a two-sided adhesive tape 43 (or epoxy). Another side of the lead frame 44 has the leads 441 connecting with the bonding pads 423 located on the active side 421 of the second chip 42 via soldering means 424 (such as solder balls). Thus the circuit of the second chip 42 use the leads 441 as connection interface to outside. The first chip 41 is constructed generally like the one shown in FIG. 3 and has solder balls 47 connecting with inner balls 414 and bonding pads 413 as connection interface to outside.

Figure 6:
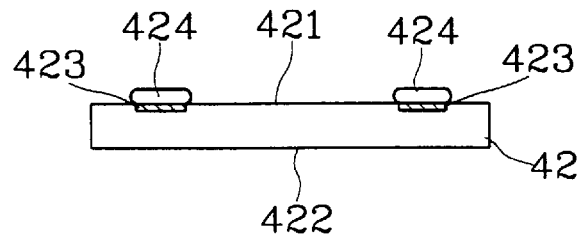
FIG. 6A–6F are sectional views of fabrication procedures for an embodiment shown in FIG. 5.
Figure 6:
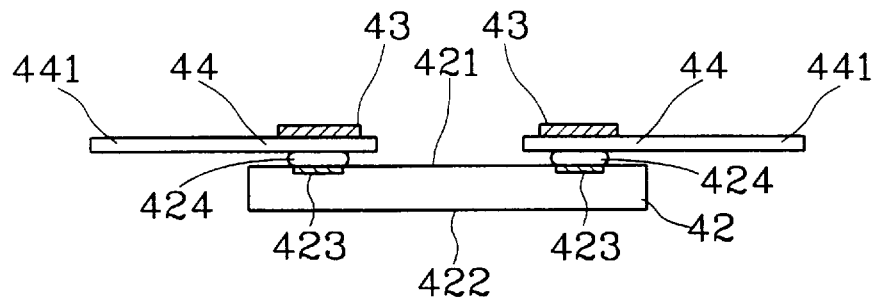
Figure 6:
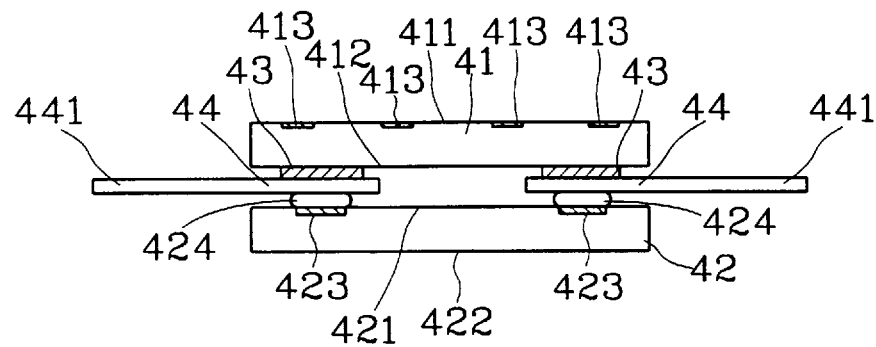
Figure 6:
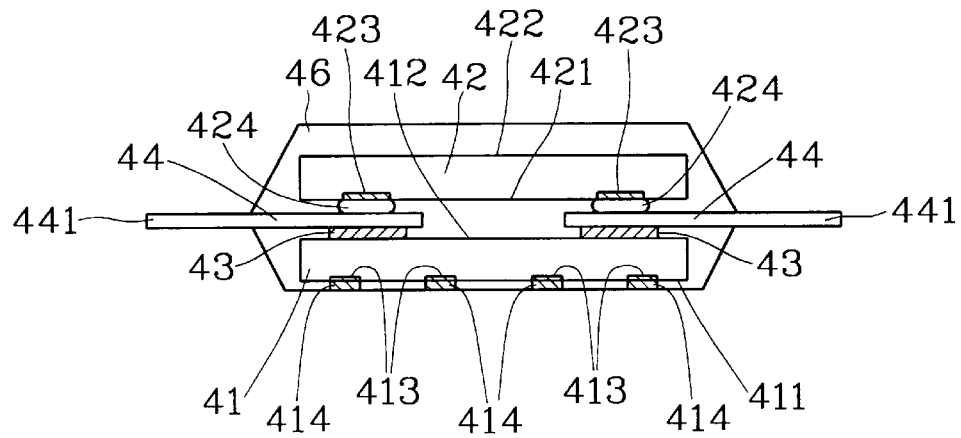
Figure 6:
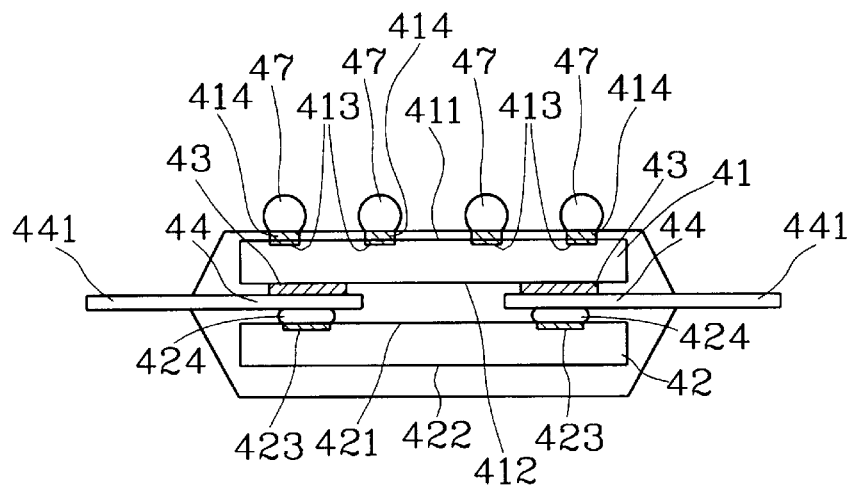
Figure 6:
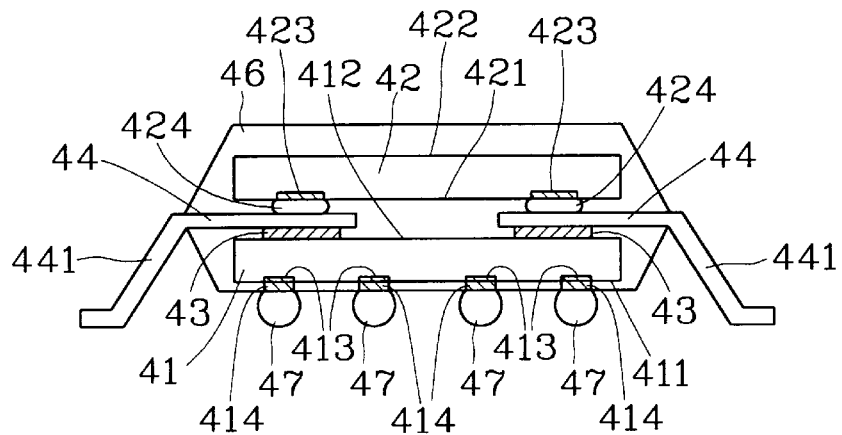

FIGS. 6A through 6F illustrate preferred fabrication steps of this embodiment as follow:

a. depositing conductive soldering means 424 on the bonding pads 423 located on the active side 421 of the second chip 42 (as shown in FIG. 6A);

b. thermo soldering one side of the leads 441 to the soldering means 424, a double-side adhesive tape 43 is furnished on another side of the leads 441 (as shown in FIG. 6B);

c. adhering the inactive side 412 of the first chip 41 to the double-sided adhesive tape 43 laying on the leads 441 so that the first chip 41 is mounted securely on the lead frame 44 (as shown in FIG. 6C);

d. depositing inner balls 414 on the bonding pads 413 located on the active side 411 of the first chip 41; then filling and wrapping the first and second chips 41 and 42 with molding epoxy 4b, with part of the leads 441 and inner balls 414 exposed to outside (as shown in FIG. 6D);

e. depositing solder balls 47 on the inner ball 414 as connection interface of the first chip to outside (as shown in FIG. 6E);

f. deforming the leads 441 toward the solder balls 47 at a desired angle, length and shape to form a complete IC package 40 (as shown in FIG. 6F).

Through aforesaid procedures, the multi-chips IC package of this invention holds two or more same or different IC chips in a package at a small dimension and length, thus effectively resolves the bulky or lengthy problem of conventional LOC or BGA design. The structure is simple and easy to produce at low cost. The IC package design also becomes much more flexible and versatile.

It may thus be seen that the objects of the present invention set forth herein, as well as those made apparent from the foregoing description, are efficiently attained. While the preferred embodiments of the invention have been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A fabrication method for a multi-chips semiconductor package which has an active side and an inactive side on each chip, said fabrication method comprising the steps of:
   a. attaching a lead frame which has a plurality of leads on the inactive side of a first chip;
   b. adhering the inactive side of a second chip to the inactive side of the first chip;
   c. wire bonding the active side of the second chip to the leads; and
   d. depositing a plurality of inner balls at selected locations of the active side of the first chip, filling molding epoxy to wrap around the first and second chips with part of the leads and inner balls exposed to ambient surroundings.

2. The fabrication method of claim 1 further comprising the following steps after the step d.:
   a. depositing a plurality of solder balls on the inner ball locations; and
   b. deforming leads toward the solder balls at a selected angle and length.

3. The fabrication method of claim 1 wherein the second chip is adhered to the first chip by means of epoxy.

4. The fabrication method of claim 1 wherein the second chip is adhered to the first chip by means of a double-sided adhesive tape.

5. The fabrication method of claim 1 wherein circuitry in the first chip does not directly connect with circuitry in the second chip, in addition, the leads do not connect with the solder balls directly.

6. The fabrication method of claim 1 the first chip and second chip have different function.

7. The fabrication method of claim 1 the first chip and the second chip have same function.

8. A fabrication method for a multi-chips semiconductor package which has an active side and an inactive side on each chip, comprising the steps of:
   a. depositing on selected location of the active side of a second chip a plurality of conductive solder means as connection interface of a circuitry in the second chip to outside,
   b. soldering the solder means to one side of a plurality of leads of a lead frame;
   c. adhering the inactive side of a first chip to another side of the lead frame; and
   d. depositing a plurality of inner balls on selected locations of the active side of the first chip, and wrapping the first chip and the second chip by molding epoxy with part of the inner balls and leads exposed to ambient surroundings.

9. The fabrication method of claim 8 further comprising the following steps:
   a. depositing a plurality of solder balls on the selected locations of the inner balls; and
   b. deforming the leads toward the solder balls at a selected angle and length.

10. The fabrication method of claim 8, wherein the inactive side of the first chip engages with said another side of the lead frame through a two-sided adhesive tape.

11. The fabrication method of claim 8, wherein the circuitry of the first chip does not connect with the circuitry of the second chip directly, in addition, the leads do not connect with the solder balls directly.

12. The fabrication method of claim 8, wherein the first chip and the second chip have different function.

* * * * *